United States Patent [19]

Lee

[11] Patent Number: 4,820,952

[45] Date of Patent: Apr. 11, 1989

[54] FILM SPEAKER USING A PIEZO-ELECTRIC ELEMENT

[75] Inventor: Kye S. Lee, Kyungki, Rep. of Korea

[73] Assignee: Samsung Electro-Mechanics Co., Ltd., Kyungki, Rep. of Korea

[21] Appl. No.: 97,628

[22] Filed: Sep. 16, 1987

[30] Foreign Application Priority Data

| | | | |
|---|---|---|---|
| Sep. 16, 1986 | [KR] | Rep. of Korea | 86-14341 |
| Sep. 16, 1986 | [KR] | Rep. of Korea | 86-14342 |
| Sep. 30, 1986 | [KR] | Rep. of Korea | 86-15012 |

[51] Int. Cl.[4] ............................................. H01L 41/08

[52] U.S. Cl. .................................... 310/334; 310/800; 310/328; 310/322; 381/190

[58] Field of Search ................................ 310/321-324, 310/328, 800, 334, 335; 381/190

[56] References Cited

U.S. PATENT DOCUMENTS

| | | | |
|---|---|---|---|
| 1,873,715 | 8/1932 | Meissner | 310/328 |
| 4,354,134 | 10/1982 | Micheron | 310/328 X |
| 4,401,911 | 8/1983 | Ravinet et al. | 310/800 |
| 4,414,436 | 11/1983 | Sashida et al. | 310/190 X |

FOREIGN PATENT DOCUMENTS

| | | | |
|---|---|---|---|
| 0035558 | 3/1980 | Japan | 381/190 |

*Primary Examiner*—Mark O. Budd

*Attorney, Agent, or Firm*—Michael N. Meller

[57] ABSTRACT

A film speaker has a film diaphragm for transducing mechanical vibrations into sound waves and a plurality of piezo-electric elements for transducing electrical elements for transducing electrical signals into electrical vibrations. The piezo-electric elements are arranged in first and second grooves of a frame. The first and second edges of the film diaphragm are held between end covers and the frame such that the film diaphragm is coupled to the piezo-electric elements, one portion of V-shaped cross section being coupled to one row of piezo-electric elements and another portion of V-shaped cross section being coupled to the other row of piezo-electric elements.

4 Claims, 5 Drawing Sheets

FILM SPEAKER USING A PIEZO-ELECTRIC ELEMENT

FIELD OF THE INVENTION

The present invention relates to a speaker particularly, to a film speaker in which a film diaphragm is controlled by a piezo-electric element.

BACKGROUND OF THE INVENTION

Speakers are generally classified as one of two types: dynamic speakers and crystal speakers utilizing a piezo-electric element.

The dynamic speaker is composed of a magnetic circuit, a voice coil and cone paper. Dynamic speakers are widely used due to their simple structure and high modulation characteristics.

However, there are also several drawbacks attributed to the large size and heavy weight of dynamic speakers. Recently, crystal speakers were developed which removed such drawbacks. In crystal speakers, the piezo-electric element transduces electric signals into sound signals. When voltage is supplied to the piezo-electric element, mechanical vibration occurs. This is delivered to the diaphragm which then generates the sound wave. Crystal speakers are smaller and lighter than dynamic speakers, are convenient to use and possess the advantages of easy assembly and mass production.

However, since the sound pressure characteristic of the piezo-electric element belongs to the high level sound range, crystal speakers are not suitable for reproducing medium or low level sounds. This drawback restricts the use of crystal speakers to only tweeters for high level sounds.

In this respect, the present invention provides a film speaker which is composed of a piezo-electric element and a film diaphragm in order to eliminate the above-mentioned problems of prior art speakers and to achieve a wider range of sound pressure characteristics. It also provides improvements in the position of the film diaphragm and the piezo-electric element, so that the film speaker can produce better quality sound pressure characteristics.

SUMMARY OF THE INVENTION

The present invention is the installation of a row of piezo-electric elements on both sides of a frame, to which elements a film diaphragm forming an arch is attached.

The combination of the high level sound pressure characteristic of the piezo-electric elements with the shock-absorbing function of the film diaphragm can produce improved sound pressure characteristics even for medium and low level sounds.

In addition, by having V-shaped folds located near the edge of the film diaphragm and a V-shaped groove on the piezo-electric element, the crease of the fold in the film fits securely into the V-shaped groove on the upper surface of the piezo-electric element. This improves the contact between the film diaphragm and the piezo-electric element and aids the transmission of the vibration of the piezo-electric element to the film diaphragm.

The present invention also incorporates several holes into the frame, under the lower part of each piezo-electric element, in order to prevent any interference from the reflective wave which is produced when the vibration wave of a piezo-electric element hits the frame. Also, the present invention provides a transparent film diaphragm. Accordingly, the present invention improves the sound pressure characteristic for medium and low level sounds by means of the film diaphragm which buffers the high level sound pressure characteristic of piezo-electric element. The decrease in the size and weight of the speaker makes it more convenient to handle and decreases the length of the production process, which will bring about a reduction in production costs.

DETAILED DESCRIPTION OF THE PREFERRED EMBODIMENTS

The detailed description of the film speaker in accordance with the invention for each embodiment is as follows.

Figure 1:
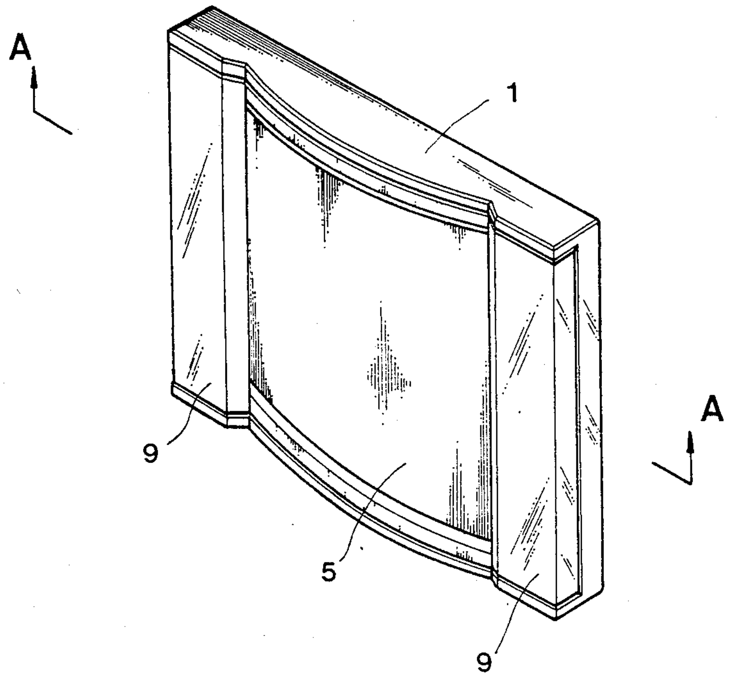
FIG. 1 is a perspective view of the film speaker according to the present invention.

As seen in FIG. 1, the film diaphragm 5 is mounted in a frame by edge covers 9 in accordance with the first embodiment of the invention.

Figure 2:
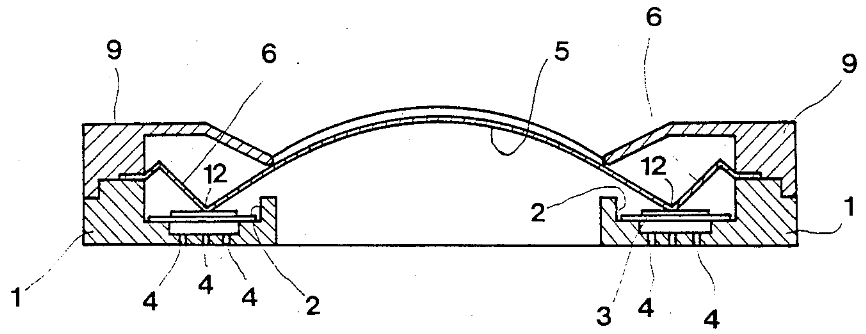
FIG. 2 is a A—A line sectional view of FIG. 1.

As shown in FIG. 2, each side of the frame 1 has a groove 2 which contains respective piezo-electric element 3 on the bottom. The creases of the folds in the film near the edges of the film diaphragm 5 having a square projection are attached to the upper portion of the respective piezo-electric elements. The edge portions 6 of the film diaphragm 5 are fixed to the frame 1.

Several holes 4 are formed in the lower portion of each groove 2 in the frame. Vibrational waves produced by the vibration of the piezo-electric elements 3 are emitted through the holes 4 so as to prevent the generation of reflection waves.

When electricity is supplied to each piezo-electric element 3, it begins to vibrate and these vibrations are transmitted to the film diaphragm 5, which reproduces the sound. In the meantime, the oscillating waves from the bottom are emitted through the holes 4 without being reflected inside the groove 2. Due to this arrangement, the vibrational waves of the piezo-electric element 3 caused by the current signal are not interfered with by the reflection waves.

Figure 3:
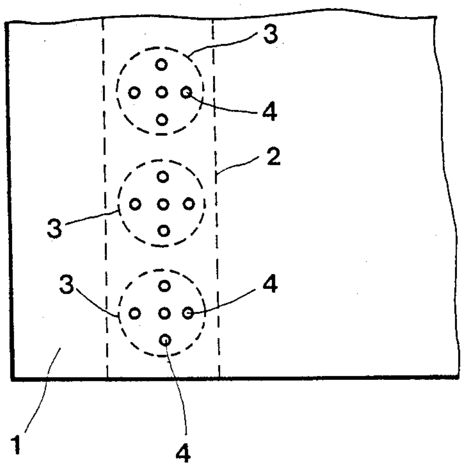
FIG. 3 is a magnified bottom view according to a first embodiment of the present invention.

FIG. 3, the exploded bottom view, shoes in detail the several holes 4 located in the bottom of a respective groove 2 which pass through the lower portion of the frame 1.

Figure 4:
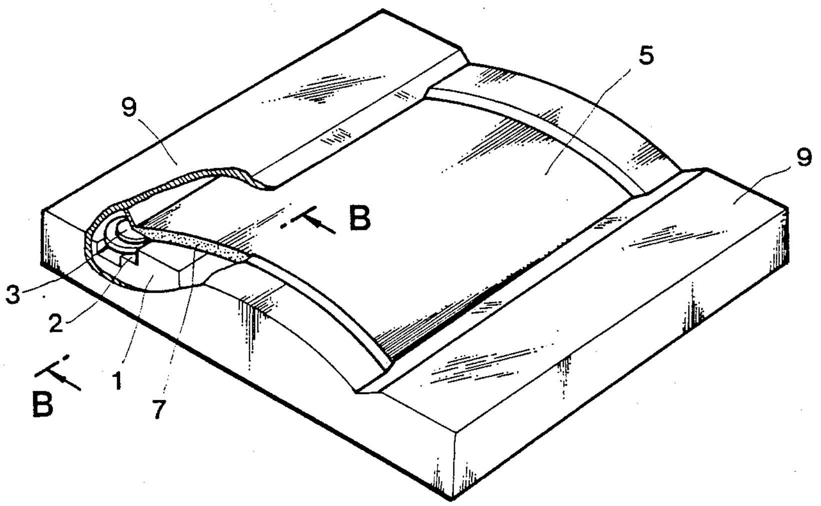
FIG. 4 is a perspective view according to a second embodiment of the present invention.

FIG. 4 shows a second embodiment of the invention.

The film diaphragm 5 comes into contact with the upper portion of the piezo-electric elements 3 which are on either side of the frame 1.

The creases in the folds of the film diaphragm 5 are respectively attached to the piezo-electric elements 3 and a soft vibration-damping element 7 is adhered to the underside of the film diaphragm 5.

By properly regulating the vibration of the film diaphragm 5, the vibration is equalized and also any excessive vibration is removed so that the sensitivity of medium and low level sounds can be improved.

Figure 5:
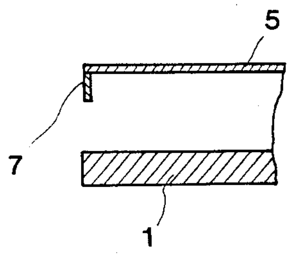
FIG. 5 is B—B line sectional view of FIG. 4

FIG. 5 is a sectional view taken along line B—B of FIG. 4, which shows that the soft element 7 is applied to the upper and lower edges of the film diaphragm.

Figure 6:
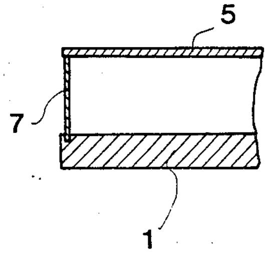
FIG. 6 is another example of the second embodiment.

FIG. 6 shows a variation of the second embodiment, wherein the soft element 7 is longer than that shown in FIG. 5 and is attached to the frame.

Figure 7:
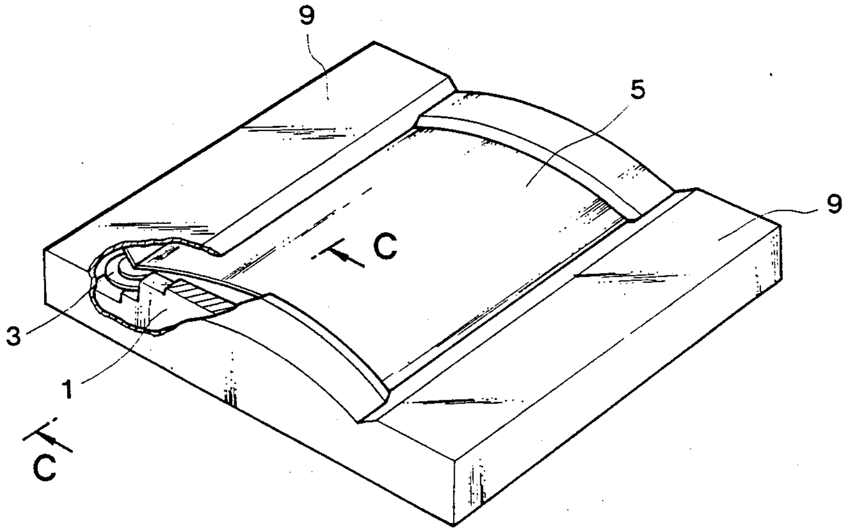
FIG. 7 is a perspective view of the film speaker according to a third embodiment of the present invention.

FIG. 7 is a perspective view of a film speaker in accordance with a third embodiment of the invention. Several piezo-electric elements are installed on both sides of the frame and the upper sides of the piezo-electric elements 3 are attached to the creases in the folds of the film diaphragm 5.

Figure 8:
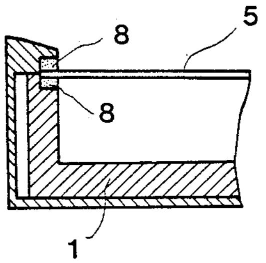
FIG. 8 is a C—C line sectional view of FIG. 7.

As shown in FIG. 8, the edges of film diaphragm 5 are secured between the frame 1 and the edge cover 9 by means of a buffer element 8. This buffer element 8 is made of rubber, sponge, plastic foam or resin or similar material. It is placed between the frame 1 and the edge cover 9 and is attached to the film diaphragm 5 in order to remove any unequal vibrations generated on the edges of the film diaphragm 5 by absorbing any noise produced by the edges of the film diaphragm.

Figure 9:
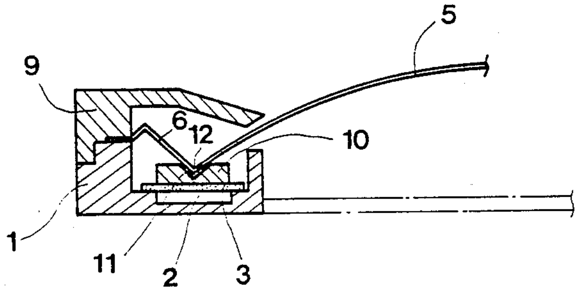
FIG. 9 is a perspective view of the film speaker according to a fourth embodiment of the present invention.

FIG. 9 is a sectional view of a film speaker in accordance with a fourth embodiment of the invention. Attached to the upper surface of the piezo-electric element 3 is a transmission element 10 having a V-shaped groove 11 which holds the crease portion 12 of the film diaphragm 5.

Figure 10:
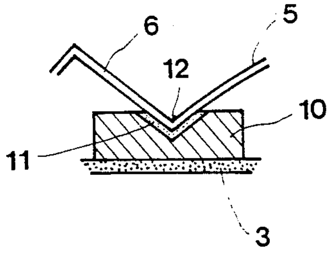
FIG. 10 is a magnified sectional view of part of FIG. 9.

FIG. 10 is a magnified view of a portion of FIG. 9. It shows that the V-shaped groove 11 is located on the upper side of the transmission element 10 which is attached to the upper surface of the piezo-electric element 3. This V-shaped groove 11 receives the crease of the fold 12 in the film diaphragm 5.

By having a V-shaped groove 11 in the transmission element 10 and by fitting the creased portion 12 of the film diaphragm 5 securely into that groove, it is not necessary to individually place the crease portion 12 of the film diaphragm 5 in the middle of the transmission element 10 and the film diaphragm 5 is not easily broken once the creased portion 12 and V-shaped groove 11 are engaged.

Figure 11:
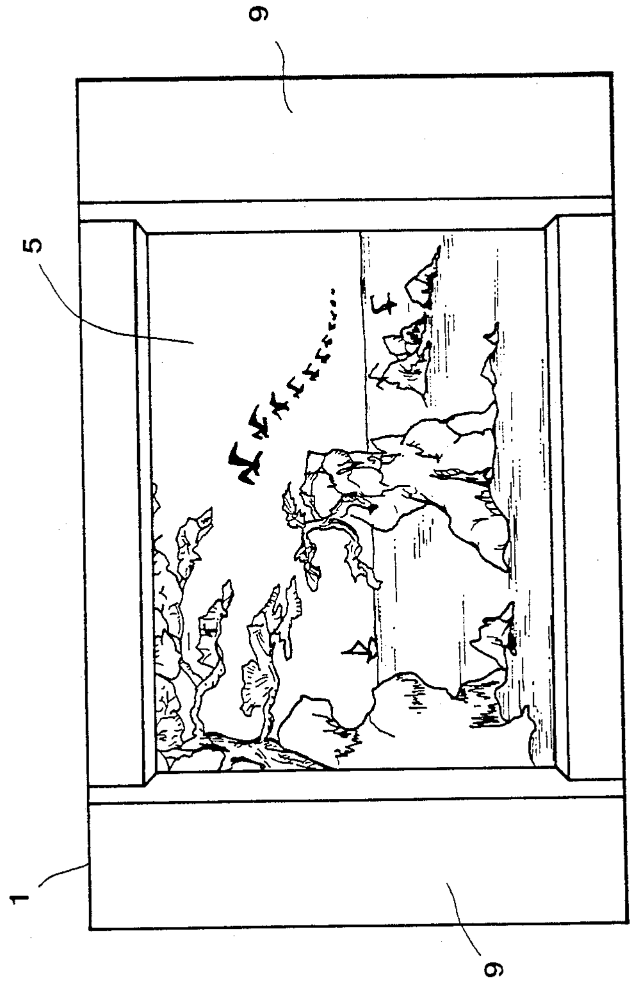
FIG. 11 is a front view of the film speaker in a case where a picture on the inside frame is seen through the transparent diaphragm.

FIG. 11 shows the state of the picture on the inside of the frame 1 as seen through the film diaphragm 5. If the film diaphragm 5 is made of transparent material, the picture can be seen from the outside.

In the case where the picture is attached to the frame inside the film speaker and the speaker is installed in the wall, the film speaker also serves as a picture frame by utilizing the transparent film diaphragm 5.

In addition, since the film speaker of the present invention is thin compared with its width, it is very convenient to hang it on the wall.

The arch-shape of the film diaphragm enlarges the range of the listening area.

The foregoing preferred embodiments are exemplary only and are not intended to limit the scope of the claims appended hereto. Modifications and variations within the scope of the invention will be readily apparent to a practitioner of ordinary skill in the art.

What is claimed is:

1. A film speaker for producing sound signals from electrical signals, comprising:

a film diaphragm having first and second edges for transducing mechanical vibrations into sound waves;

piezo-electric means for transducing electrical signals into mechanical vibrations; and means for holding said film diaphragm in coupling with said piezo-electric means, said holding means having a pair of grooves along which said piezo-electric means are arranged and means for securing said first and second edges of said film diaphragm, wherein said piezo-electric means comprise first and second pluralities of piezo-electric elements, said first plurality being arranged along one of said grooves and said second plurality being arranged along the other of said grooves, said film diaphragm is in contact with an upper surface of each piezo-electric element, and a plurality of holes are formed in said holding means for each piezo-electric element, each plurality of holes allowing vibrational waves produced by a corresponding one of said piezo-electric elements to propagate to the space external to said holding means.

2. A film speaker for producing sound signals from electrical signals, comprising:

a film diaphragm having first and second edges for transducing mechanical vibrations into sound waves;

piezo-electric means for transducing electrical signals into mechanical vibrations; and means for holding said film diaphragm in coupling with said piezo-electric means, said holding means having a pair of grooves along which said piezo-electric means are arranged and means for securing said first and second edges of said film diaphragm;

wherein said piezo-electric means comprise first and second pluralities of piezo-electric elements, said first plurality being arranged along one of said grooves and said second plurality being arranged along the other of said grooves, said film diaphragm is in contact with an upper surface of each piezo-electric element, and said holding means comprises a frame and a pair of end covers, said first edge of said film diaphragm being arranged between a surface of one of said end covers and a first surface of said frame and said second edge of said film diaphragm being arranged between a surface of the other of said end covers and a second surface of said frame, further comprising first and second buffer means, said first buffer means being arranged between said first edge of said film diaphragm and said surface of said one end cover and between said first edge of said film diaphragm and said first surface of said frame, and second buffer means being arranged between said second edge of said film diaphragm and said surface of said other end cover and between said second edge of said film diaphragm and said second surface of said frame.

3. The film speaker as defined in claim 2, wherein said first and second buffer means are made of a material taken from the group consisting of rubber, sponge, plastic foam and resin.

4. A film speaker for producing sound signals from electrical signals, comprising:

a film diaphragm having first and second edges for transducing mechanical vibrations into sound waves;

piezo-electric means for transducing electrical signals into mechanical vibrations; and means for holding said film diaphragm in coupling with said piezo-electric means, said holding means having a pair of grooves along which said piezo-electric means are arranged and means for securing said first and second edges of said film diaphragm;

wherein said film diaphragm comprises a first portion having an arch-shaped cross section, a second portion having a V-shaped cross section arranged between said first portion and said first edge, and a third portion having a V-shaped cross section arranged between said first portion and said second edge, each of said cross sections being constant in a first direction, further comprising transmission means arranged between said piezo-electric means and said film diaphragm, said transmission means having grooves of V-shaped profile for receiving said second and third portions of said film diaphragm.

* * * * *